Figure 1:
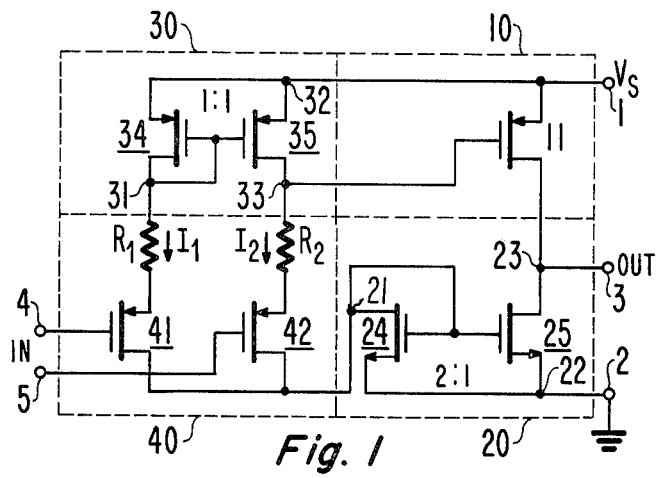

United States Patent [19]

Rosenthal

[11] 4,047,059

[45] Sept. 6, 1977

[54] COMPARATOR CIRCUIT

[75] Inventor: Bruce David Rosenthal, Highland Park, N.J.

[73] Assignee: RCA Corporation, New York, N.Y.

[21] Appl. No.: 689,267

[22] Filed: May 24, 1976

[51] Int. Cl.² ............................................. H03K 5/20
[52] U.S. Cl. ................................... 307/355; 307/230; 307/304; 330/22; 330/35
[58] Field of Search ........... 307/235 R, 235 E, 235 F, 307/235 H, 235 T, 304, 230; 330/30 D, 38 M, 22, 35

[56] References Cited

U.S. PATENT DOCUMENTS 3,702,942  11/1972  Aguirre ........................... 307/235 B Primary Examiner—John Zazworsky
Attorney, Agent, or Firm—H. Christoffersen; A. L. Limberg; R. G. Coalter

[57] ABSTRACT

A switch, connected in series with a current source across a source of operating voltage, is opened and closed in accordance with the ratio of two input signals to produce an output signal. The current source conducts an output current directly or inversely proportional to the sum of the input signals whereby a parameter of the switched output signal, such as slew rate, is proportional to a parameter of the input signals, such as common mode voltage.

10 Claims, 3 Drawing Figures

Fig. 1

COMPARATOR CIRCUIT

This invention relates to comparators and particularly to analog voltage comparators for producing an output signal indicative of the relative magnitudes of two input signals.

In conventional comparators it is customary to control the ratio of two currents in accordance with input signals to be compared and to subtract the currents, one from another, to produce a difference signal for controlling an output switch. One problem with such comparators is that the subtraction and switching process results in a loss of certain information regarding the input signals, namely, common-mode information. The present invention is directed to meeting the need for a comparator in which common-mode information is retained, to a certain extent, and used to advantage to control parameter, such as slew rate, of the output signal.

Figure 2:
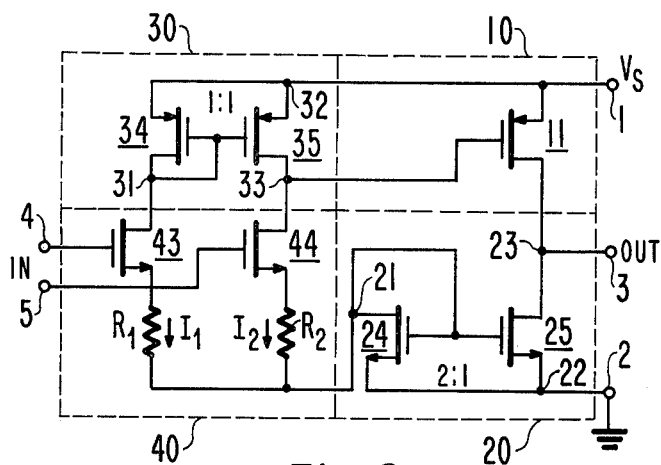
Figure 3:
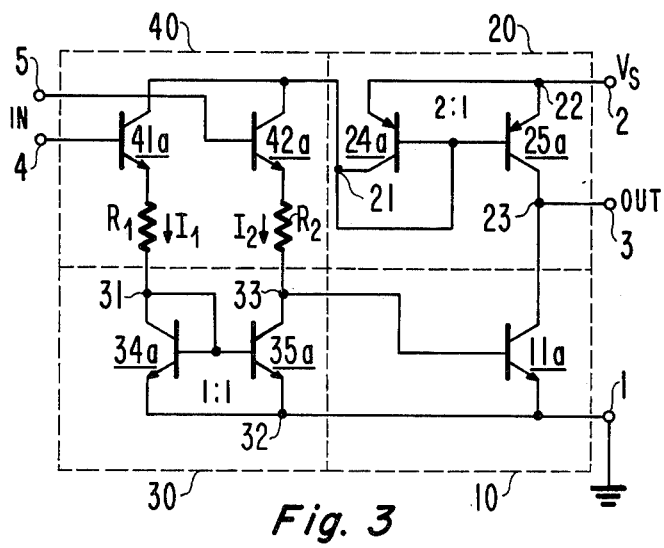

In the drawings:

FIGS. 1, 2 and 3 are circuit diagrams of comparators embodying the invention.

The comparator of FIG. 1 comprises supply terminals 1 and 2, an output switch 10, a pair of complementary current mirror amplifiers (CMA's) 20 and 30, and an input circuit 40.

Input circuit 40 comprises a pair of P-channel field effect transistors 41 and 42 connected at the gates thereof to circuit input terminals 4 and 5, respectively and at the drains thereof to input terminal 21 of CMA 20. The sources of FETs 41 and 42 are coupled via resistors $R_1$ and $R_2$, respectively, to input terminal 31 and output terminal 33, respectively, of CMA 30. Preferably, these resistors are of equal value.

CMA 20 is connected at the output terminal 23 and common terminal 22 thereof to circuit output terminal 3 and supply terminal 2. CMA 20 comprises a pair of N-channel FETs 24 and 25 connected at the sources thereof to terminal 2, at the gates thereof to terminal 21 and at the drains thereof, respectively, to terminals 21 and 23. FETs 24 and 25 are preferably selected to provide a 2:1 mirror ratio. If the comparator is implemented as a monolithic integrated circuit, for example, a 2:1 mirror ratio may be obtained by making the channel width-to-length ratio of FET 24 twice that of FET 25.

CMA 30 is connected at the common terminal 32 thereof to supply terminal 1 and comprises a pair of P-channel FETs 34 and 35 connected at the sources thereof to common terminal 32, at the gates thereof to input terminal 31 and at the drains thereof, respectively, to input terminal 31 and output terminal 33. FETs 34 and 35 are preferably selected to provide a 1:1 mirror ratio.

Output switch 10 comprises a P-channel FET 11 connected at the source thereof to supply terminal 1, at the gate thereof to output terminal 33 of CMA 30 and at the drain thereof to output terminal 23 of CMA 20.

It will be assumed in the following discussion that terminal 2 is connected to a reference point such as ground, that a positive supply voltage, $V_s$, is applied to terminal 1, that the mirror ratios (i.e., the current gains) of CMAs 20 and 30 are 2:1 and 1:1, respectively, and that input signals to be compared are applied to terminals 4 and 5.

In operation, FETs 41 and 42 in input circuit 40 operate normally as unity gain common drain amplifiers (in other words, source followers) to regulate the voltages at one end of resistors $R_1$ and $R_2$ at values slightly greater than the input voltages applied to input terminals 4 and 5, respectively. When a common mode voltage, $V_{cm}$, is applied to input terminals 4 and 5, the current $I_1$ which flows through resistor $R_1$ is "mirrored" by unity gain CMA 30 so that the current $I_2$ through resistor $R_2$ will equal $I_1$. If, as is preferred, resistors $R_1$ and $R_2$ are equal, equal voltages will be developed thereacross so that the voltages at the input and output terminals of CMA 30 will be equal. Thus, under these conditions, the gate to source voltages of FETs 35 and 11 will be equal. FET 11 may be selected to have a threshold voltage and transconductance equal to that of FET 35. If so, FET 11 will be primed to conduct the same current, $I_1$, between supply terminal 1 and output terminal 3 as conducted by FET 35.

Since the drains of FETs 41 and 42 are connected in common at the input of CMA 20, the total input current at terminal 21 is $2I_1$. If, as preferred, FETs 24 and 25 in CMA 20 are selected to provide a 2:1 mirror ratio, FET 25 will be primed to conduct a current equal to $I_1$ between output terminal 3 and supply terminal 2.

Thus, under the given assumption of a common mode voltage applied to input terminals 4 and 5, FETs 11 and 25 are primed to conduct equal currents between the circuit output terminal 3 and the supply terminals 1 and 2. This represents the "critical" or switching point of the circuit where a slight difference or imbalance to the voltages at terminals 4 and 5 will cause an imbalance in the currents conducted by FETs 11 and 25 thereby clamping the output terminal 3 to one or the other of the supply terminals. This critical condition is, in one sense, independent of the magnitude of the common mode input voltage. That is, insofar as the switching of FET 11 is concerned, it is the ratio of the input voltages which is the controlling input parameter and not the magnitudes thereof.

On the other hand, unlike prior art comparators, a measure of the magnitude of the input voltages at terminals 4 and 5 is preserved and used to advantage to control the rate of change (i.e., slew rate) of the output signal. This results because the current conducted by FET 25 in CMA 20 is proportional to the sum of the drain currents of FETs 41 and 42 in input circuit 40. In this example of the invention, if the input signal voltages at terminals 4 and 5 decrease, the currents $I_1$ and $I_2$ will increase. Thus, as the common-mode input voltage decreases (relative to terminal 2) more output current is conducted by CMA 20 and this has the effect of lowering the output impedance and increasing the slew rate. Also, an increase in supply voltage, $V_s$, in this example of the invention, will have the same effect.

The comparator of FIG. 1 may be used in general analog comparison applications such as threshold detectors and has the advantage that input signals signals at or near ground (assuming terminal 2 is grounded) may be compared without requiring dual (positive and negative) power supplies. In fact, in this example of the invention, negative input signals may be compared even though terminal 2 is grounded and a positive voltage is applied to terminal 1. In such a situation FETs 41 and 42, although connected in source follower configurations, operate in the triode region of their drain characteristics and so function not as voltage followers but as a voltage controlled resistor for controlling the currents $I_1$ and $I_2$. Otherwise, operation is the same as previously described in that the input circuit controls two currents which are added by CMA 20 for controlling the current between terminals 2 and 3, the input signal difference being detected by CMA 30 for opening and closing switch 10 depending upon the relative magnitude of the difference.

The comparator of FIG. 1 may be modified by replacing each P-channel FET with an N-channel FET and vice versa. So modified the circuit operation would be as previously described except, of course, for the direction of current flow and relative polarities.

The comparator of FIG. 1 may be modified as in FIG. 2 to provide operation in which the output signal slew rate increases as the magnitudes of the input signals (relative to terminal 2) increase. In FIG. 2 the P-channel FETs 41 and 42 have been replaced by N-channel FETs 43 and 44 which are connected at the gates thereof to input terminals 4 and 5, respectively, and at the drains thereof to input terminal 31 and output terminal 33, respectively, of the unity gain (1:1) CMA 30. The sources of FETs 43 and 44 are coupled by resistors $R_1$ and $R_2$, respectively, to the input terminal 21 of the "step-down" (2:1) CMA 20.

As in the previous example of the invention, the circuit operation is most easily understood by considering its response to common-mode input signals. Assume that terminal 2 is grounded, that a positive supply voltage $V_s$ is applied to terminal 1, and that resistors $R_1$ and $R_2$ are of equal value. Assume initially that a common mode voltage, $V_{cm}$, is applied to terminals 4 and 5 which is positive with respect to terminal 2 but less than $V_s$. In this condition FETs 43 and 44 operate as source followers to regulate the voltages across resistors $R_1$ and $R_2$ at a value slightly less than $V_{cm}$. The voltage across $R_1$, for example, will equal $V_{cm}$ minus the sum of the gate-to-source voltages of FETs 43 and 24 while that across $R_2$ will equal $V_{cm}$ minus the sum of the gate-to-source voltages of FETs 44 and 24. Thus, under the given assumptions and the further assumption that the transconductance and threshold voltages of FETs 43 and 44 are equal, resistors $R_1$ and $R_2$ will conduct equal currents ($I_1$ and $I_2$, respectively) having magnitudes directly proportional to $V_{cm}$.

Since the current $I_2$ equals $I_1$ and CMA 20 has a 2:1 mirror ratio, FET 25 will be primed to conduct a current equal to $I_1$ between terminals 3 and 2. Also, in this balanced condition, FET 35 in CMA 30 supplies the same current to terminal 33 as is withdrawn by FET 44. Because of this, the gate of FET 4 and is critically biased, that is, any slight imbalance in currents $I_1$ and $I_2$ will cause the voltage at terminal 33 to assume one of two states either turning FET 11 on or off. If, for example, $I_1$ exceeds $I_2$ the potential to terminal 33 will increase to a maximum value of $V_s$ thereby biasing FET 11 off. Conversely, if $I_2$ exceeds $I_1$, the voltage at terminal 33 will decrease approaching, as a minimum value, the voltage at the source of FET 44, thereby biasing FET 11 on.

FIG. 2 may also be operated with input signals exceeding one of the supply voltages. ($V_s$ in this case). The input signals applied to terminals 4 and 5 may be, for example, more positive than $V_s$. If so, FETs 43 and 44 will be biased in the triode region of their drain characteristics and thus will function as voltage controlled resistors (rather than as source followers) for controlling the currents $I_1$ and $I_2$.

The comparator of FIG. 3 is similar to that of FIG. 1 except that the relative potentials of terminals 1 and 2 are reversed and each FET has been replaced by a bipolar transistor equivalent to its complement. In other words, P-channel FETs have been replaced by NPN bipolar transistors and N-channel FETs have been replaced by PNP bipolar transistors. The bipolar transistors are identified by subscripted reference numbers corresponding to the FETs in FIG. 1 and the circuit has been redrawn for clarity.

The substitution of bipolar transistors which are complementary to the FETs of FIG. 1 and reversal of the supply voltages changes the circuit operation in certain respects. Assume, for example, that terminal 1 is grounded and a positive supply voltage $V_s$ is applied to terminal 2. If a common mode voltage (positive with respect to terminal 1 but less than $V_s$) is applied to terminals 4 and 5, transistors 41a and 42a will operate as emitter followers to regulate the voltage at one end of resistors $R_1$ and $R_2$, respectively, at values slightly less than the common mode voltage (the values are less due to the base emitter voltage drops which, for silicon transistor, may be a few hundred millivolts). The other ends of $R_1$ and $R_2$ are coupled to supply terminal 1 by CMA 30 (and also the base emitter junction of transistor 11a) so that the currents $I_1$ and $I_2$ vary directly as the voltage at terminals 4 and 5 but are independent, in this case, of $V_s$.

If resistors $R_1$ and $R_2$ are of equal value, the currents $I_1$ and $I_2$ will be equal so that no net current will be supplied to or withdrawn from the base of transistor 11a by CMA 30. This, as in the previous examples of the invention, represents the critical or threshold condition of the circuit wherein any imbalance in currents $I_1$ and $I_2$ will bias transistor 11a on or off. If the voltage at terminal 5 exceeds that at terminal 4, for example, $I_2$ will exceed $I_1$ so that the difference current ($I_2 - I_1$) will bias transistor 11a on. Conversely, if the terminal 4 voltage exceeds that of terminal 5, $I_1$ will exceed $I_2$. That will cause transistor 35a to clamp the base of transistor 11a to about the potential of its emitter thereby biasing transistor 11a off. For either condition, CMA 20 supplies a current to output terminal 3 from supply terminal 2 proportional to the sum of the currents $I_1$ and $I_2$. Accordingly, in this example of the invention, the rate of change of the output signal voltage (i.e., slew rate) increases as the input signal voltages increase. Also, since $I_1$ and $I_2$ are independent of $V_s$, the slew rate is also independent of $V_s$.

In each example of the invention it has been assumed that resistors $R_1$ and $R_2$ are equal and that the mirror ration (i.e., current gain) of CMA's 20 and 30 are 2:1 and 1:1, respectively. Those assumptions represent an optimum choice of parameters for minimizing input offset by assuring that the input transistors conduct substantially equal currents at the threshold or switching point and thus have substantially equal gate-to-source voltages (or base-to-emitter voltages). Input offset may be further minimized, if desired, by providing means for varying the values of resistors $R_1$ or $R_2$ or by adjusting the mirror ratio of CMA 30.

In some applications it may be desired to produce an output signal indicative of the ratio of two input signals weighted by some factor other than unity. For example, suppose it is desired to detect when one input signal exceeds twice the value of another input signal. In conventional practice, one would use a voltage divider to attenuate the larger of the two signals by a factor of two and then compare the attenuated and non-attenuated signals. A disadvantage of that approach is that the voltage divider necessarily degrades the input impedance. The same result can be achieved, without need for such a voltage divider, by appropriate selection of parameters of the comparator of this invention. For example, by selecting the value of resistor $R_1$ to be twice that of resistor $R_2$, the comparator will be at its switching threshold when the voltage at terminal 4 is twice that at terminal 5 in the examples of FIGS. 2 and 3. Alternatively, a similar result can be achieved by appropriate scaling of the mirror ratio of CMA 30.

As a final illustration of the effects of different resistance ratios and mirror ratios, consider again the comparator of FIG. 2 (the following remarks apply as well to the comparators of FIGS. 1 and 3). Assume that the value of resistor $R_1$ is twice that of resistor $R_2$ and that the mirror ratios of CMA's 20 and 30 are 3:2 and 1:2, respectively. If the input signals are such that the source voltages of FETs 43 and 44 are equal, current $I_2$ will equal $2I_1$. The sum of those currents, $3I_1$, applied to the input of CMA 20 (now assumed to have a 3:2 mirror ratio) will bias FET 25 to withdraw a current equal to $2I_1$ from output terminal 3.

Since CMA 30 is now assumed to have a 1:2 mirror ratio, FET 35 will supply the same amount of current ($2I_1$) to terminal 33 as is withdrawn by FET 44. Since the gate of FET 11 is coupled to terminal 33, this condition ($I_2 = 2I_1$) represents the critical or threshold condition of the circuit. If the input signals change such that $I_2$ exceeds $2I_1$, the potential of terminal 3 will decrease and that will bias FET 11 on, thereby clamping output terminal 3 to a voltage level slightly less than that of supply terminal 1. (The voltage is less due to the finite "on" resistance of FET 11 which conducts, under steady state, no load conditions, the same current as FET 25). Conversely, if $I_2$ is less than $2I_1$, the excess current supplied to terminal 33 will increase the potential thereof thereby turning FET 11 off. When that happens, FET 25 in CMA 20 will clamp output terminal 3 to the potential of supply terminal 2.

What is claimed is:

1. A comparator, for producing an output signal dependent upon both the ratio of the magnitudes and the sum of the magnitudes of first and second input signals to be compared, comprising, in combination:
   two supply terminals for receiving an operating voltage thereacross and a circuit output terminal for providing said output signal thereat;
   input means for conducting first and second currents between said supply terminals and for independently controlling the magnitudes thereof in accordance with the magnitudes of said first and second input signals, respectively;
   controlled conduction means coupled between one of said supply terminals and said circuit output terminal for conducting a current therebetween proportional to a control signal;
   means for summing said first and second currents to obtain said control signal, whereby said current conducted by said controlled conduction means varies in proportion to the sum of the magnitudes of said first and second input signals;
   switch means connected between said output terminal and the other of said supply terminals; and
   means coupled to said switch means and responsive to said first and second currents for closing said switch means when the ratio between said first and second currents is a first value and for opening said switch means when said ratio is a different value.

2. A comparator comprising, in combination:
   two supply terminals for receiving an operating voltage thereacross and a circuit output terminal for providing an output signal thereat;
   a first current mirror amplifier having a common terminal coupled to one of said supply terminals, an output terminal coupled to said circuit output terminal and having also an input terminal;
   a transistor having a conduction path connected at one end thereof to said circuit output terminal and at the other end thereof to an other of said supply terminals, said transistor having also a control electrode;
   a second current mirror amplifier having a common terminal coupled to said other of said supply terminals, an output terminal coupled to said control electrode of said transistor and having also an input terminal;
   a first controllable current path connected between said input terminals of said current mirror amplifiers for conducting a first current therebetween in accordance with a first input signal, and
   a second controllable current path connected between said input terminal of said first current mirror amplifier and said output terminal of said second current mirror amplifier for conducting a second current therebetween in accordance with a second input signal.

3. The comparator recited in claim 2, wherein:
   said first controllable current path comprises a first impedance and a first field effect transistor, said first field effect transistor having a gate electrode for receiving said first input signal, a drain electrode coupled to said input terminal of said first current mirror amplifier and a source electrode coupled via said first impedance to said input terminal of said second current mirror amplifier; and wherein
   said second controllable current path comprises a second impedance and a second field effect transistor, said second field effect transistor having a gate electrode for receiving said second input signal, a drain electrode coupled to said input terminal of said first current mirror amplifier and a source electrode coupled via said second impedance to said output terminal of said second current mirror amplifier.

4. The comparator recited in claim 2, wherein:
   said first controllable current path comprises a first impedance and a first field effect transistor, said first field effect transistor having a gate electrode for receiving said first input signal, a drain electrode coupled to said input terminal of said second current mirror amplifier and a source electrode coupled via said first impedance to said input terminal of said first current mirror amplifier; and wherein
   said second controllable current path comprises a second impedance and a second field effect transistor, said second field effect transistor having a gate electrode for receiving said second input signal, a drain electrode coupled to said output terminal of said second current mirror amplifier and a source electrode coupled via said second impedance to said input terminal of said first current mirror amplifier.

5. The comparator recited in claim 2, wherein:
   said first controllable current path comprises a first impedance and a first bipolar treatment transistor, said first bipolar transistor having a base electrode for receiving said first input signal, a collector electrode coupled to said input terminal of said first current mirror amplifier and an emitter electrode coupled via said first impedance to said input terminal of said second current mirror amplifier; and wherein said second controllable current paths comprises a second impedance and a second bipolar transistor, said second bipolar transistor having a base electrode for receiving said second input signal, a collector electrode coupled to said input terminal of said first current mirror amplifier and an emitter electrode coupled via said second impedance to said output terminal of said second current mirror amplifier.

6. The comparator recited in claim 2 wherein said first current mirror amplifier comprises at least two transistors of a first conductivity type, said transistors being selected for a mirror ratio substantially equal to 2:1 and wherein said second current mirror amplifier comprises at least two transistors of a second conductivity type, said transistors being selected for a mirror ratio substantially equal to 1:1.

7. A comparator comprising, in combination:

first and second supply terminals and an output terminal;

first, second and third field effect transistors of a first conductivity type, each having source, gate and drain electrodes, the source electrode of each being coupled to said first supply terminal, the drain electrode of the first transistor being coupled to said output terminal, the drain electrode of the second transistor being coupled to said gate electrode of said first transistor, the gate and drain electrodes of the third transistor being coupled to the gate electrode of said second transistor;

fourth and fifth field effect transistors of a second conductivity type, each having source, gate and drain electrodes, the source electrode of each being coupled to said second supply terminal, the drain electrode of the fourth transistor being coupled to said output terminal, the gate and drain electrodes of said fifth transistor being coupled to the gate electrode of said fourth transistor;

a first controllable current path coupled between said drain electrodes of said third and fifth transistors for conducting a first current therebetween and controlling the value thereof in accordance with a first input signal; and a second controllable current path coupled between said drain electrodes of said second and fifth transistors for conducting a second current therebetween and controlling the value thereof in accordance with a second input signal.

8. The comparator recited in claim 7 wherein:

said first controllable current path comprises a sixth field effect transistor of said first conductivity type having a gate electrode for receiving said first input signal, a drain electrode coupled to said drain electrode of said fifth transistor and having a source electrode coupled via a first impedance to said drain electrode of said third transistor; and wherein said second controllable current path comprises a seventh field effect transistor of said first conductivity type having a gate electrode for receiving said second input signal, a drain electrode coupled to said drain electrode of said fifth transistor and having a source electrode coupled via a second impedance to said drain electrode of said second transistor.

9. The comparator recited in claim 7 wherein:

said first controllable current path comprises a sixth field effect transistor of said second conductivity type having a gate electrode for receiving said first input signal, a drain electrode coupled to said drain electrode of said third transistor and having a source electrode coupled via a first impedance to said drain electrode of said fifth transistor; and wherein said second controllable current path comprises a seventh field effect transistor of said second conductivity type having a gate electrode for receiving said second input signal, a drain electrode coupled to said drain electrode of said second transistor and having a source electrode coupled via a second impedance to said drain electrode of said fifth transistor.

10. The comparator recited in claim 7 wherein:

said third field effect transistor has a channel width-to-length ratio substantially equal to that of said second field effect transistor; and wherein said fifth field effect transistor has a channel width-to-length ratio substantially equal to twice that of said fourth field effect transistor.

* * * * *